United States Patent
Sumiyoshi et al.

(10) Patent No.: US 12,057,862 B2
(45) Date of Patent: Aug. 6, 2024

(54) DATA DECOMPRESSION DEVICE, MEMORY SYSTEM, AND DATA DECOMPRESSION METHOD

(71) Applicant: Kioxia Corporation, Tokyo (JP)

(72) Inventors: Masato Sumiyoshi, Yokohama Kanagawa (JP); Takashi Takemoto, Yokohama Kanagawa (JP); Keiri Nakanishi, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 155 days.

(21) Appl. No.: 17/939,692

(22) Filed: Sep. 7, 2022

(65) Prior Publication Data
US 2023/0291418 A1    Sep. 14, 2023

(30) Foreign Application Priority Data
Mar. 11, 2022    (JP) ................. 2022-038199

(51) Int. Cl.
*H03M 7/40*    (2006.01)
*H03M 7/30*    (2006.01)

(52) U.S. Cl.
CPC ......... *H03M 7/405* (2013.01); *H03M 7/6005* (2013.01); *H03M 7/30* (2013.01); *H03M 7/40* (2013.01)

(58) Field of Classification Search
CPC ...... H03M 7/405; H03M 7/6005; H03M 7/40; H03M 7/30
See application file for complete search history.

(56) References Cited

U.S. PATENT DOCUMENTS

| | | |
|---|---|---|
| 10,177,782 B2 | 1/2019 | Satpathy et al. |
| 10,911,063 B2 | 2/2021 | Suresh et al. |
| 2005/0058205 A1* | 3/2005 | Holcomb ............... H04N 19/70 375/240.23 |
| 2017/0187388 A1 | 6/2017 | Satpathy et al. |
| 2020/0036389 A1 | 1/2020 | Suresh et al. |
| 2021/0250043 A1 | 8/2021 | Oikawa et al. |

OTHER PUBLICATIONS

Deutsch, P., "DEFLATE Compressed Data Format Specification version 1.3", RFC 1951, May 1996, pp. 1-15, DOI: 10.17487/RFC1951, https://datatracker.ietf.org/doc/html/rfc1951/.

* cited by examiner

*Primary Examiner* — Joseph J Lauture
(74) *Attorney, Agent, or Firm* — Maier & Maier, PLLC

(57) ABSTRACT

According to one embodiment, a data decompression device decodes a code included in compressed data into a symbol. The data decompression device includes a first code length generation unit and a second code length generation unit. The first code length generation unit generates a first code length of a first code included in the compressed data by arithmetic calculation. The second code length generation unit generates a second code length of a second code by using a table. The second code is included in the compressed data. The second code is subsequent to the first code. The table indicates at least the first code and the second code length that is associated with the first code.

20 Claims, 9 Drawing Sheets

| Code | Extra bit length | Dictionary match length |
|---|---|---|
| 257 | 0 | 3 |
| 258 | 0 | 4 |
| 259 | 0 | 5 |
| 260 | 0 | 6 |
| 261 | 0 | 7 |
| 262 | 0 | 8 |
| 263 | 0 | 9 |
| 264 | 0 | 10 |
| 265 | 1 | 11,12 |
| 266 | 1 | 13,14 |
| 267 | 1 | 15,16 |
| 268 | 1 | 17,18 |
| 269 | 2 | 19-22 |
| 270 | 2 | 23-26 |
| 271 | 2 | 27-30 |
| 272 | 2 | 31-34 |
| 273 | 3 | 35-42 |
| 274 | 3 | 43-50 |
| 275 | 3 | 51-58 |
| 276 | 3 | 59-66 |
| 277 | 4 | 67-82 |
| 278 | 4 | 83-98 |
| 279 | 4 | 99-114 |
| 280 | 4 | 115-130 |
| 281 | 5 | 131-162 |
| 282 | 5 | 163-194 |
| 283 | 5 | 195-226 |
| 284 | 5 | 227-257 |
| 285 | 0 | 258 |

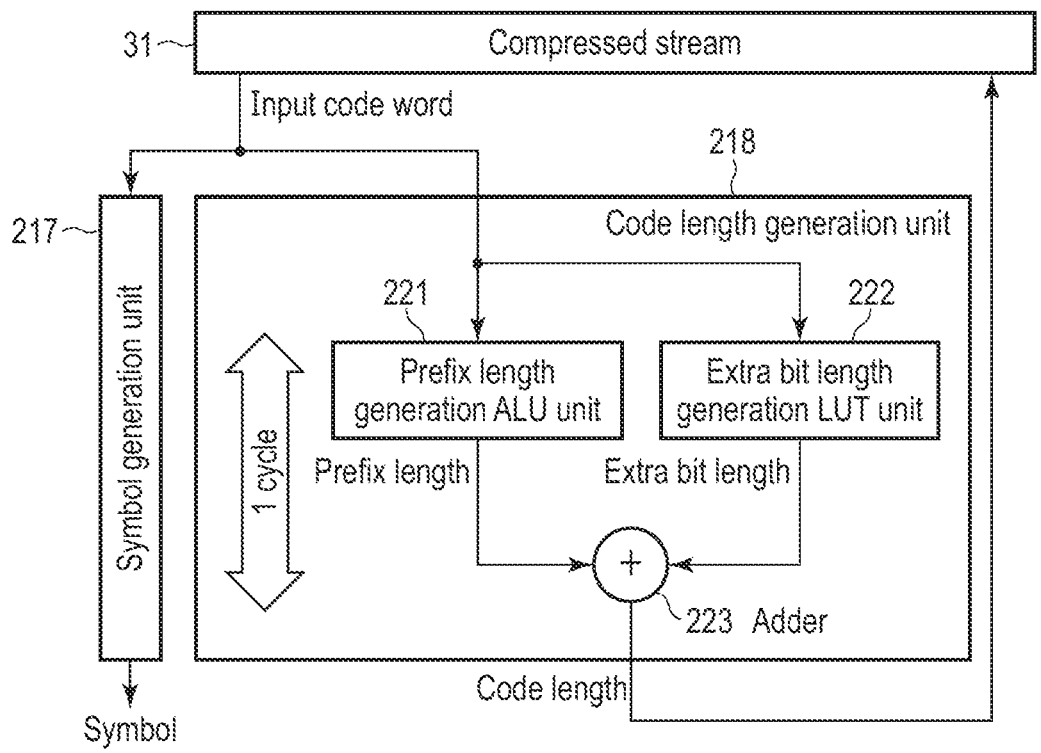
F I G. 8
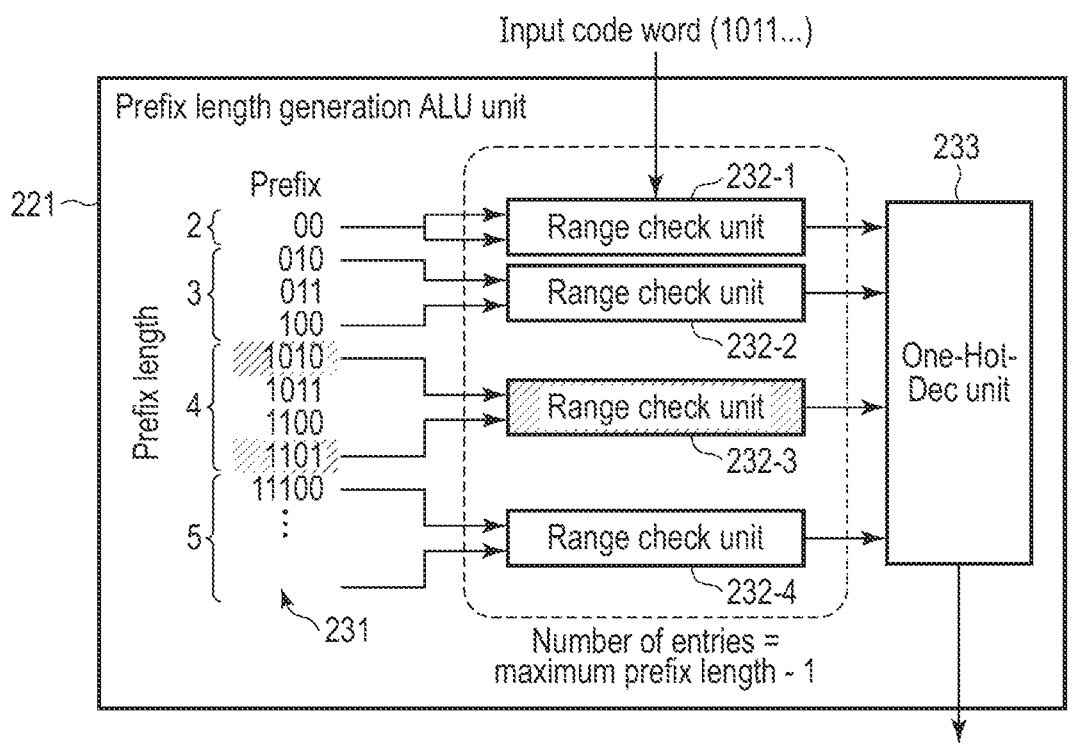
F I G. 9

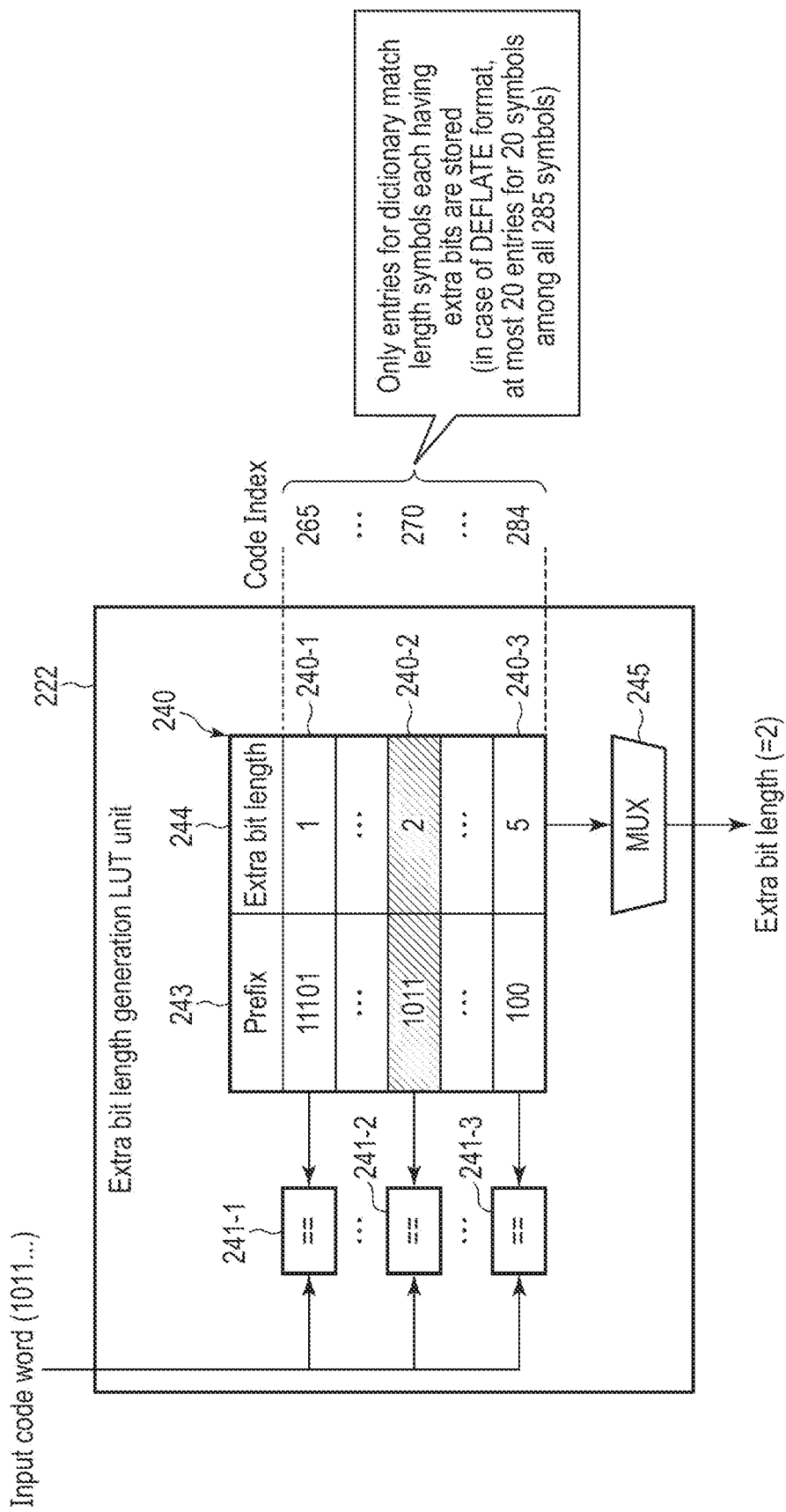
F I G. 10

DATA DECOMPRESSION DEVICE, MEMORY SYSTEM, AND DATA DECOMPRESSION METHOD

CROSS-REFERENCE TO RELATED APPLICATIONS

This application is based upon and claims the benefit of priority from Japanese Patent Application No. 2022-038199, filed Mar. 11, 2022, the entire contents of which are incorporated herein by reference.

FIELD

Embodiments described herein relate generally to a data decompression device, a memory system, and a data decompression method.

BACKGROUND

As a compression scheme for compressing data to generate compressed data (compressed stream), DEFLATE format defined in RFC1951 is known. The DEFLATE format defines entropy coding for a symbol obtained as a result of lexicographic coding.

The entropy coding is a variable length coding scheme that dynamically generates a code table based on a frequency of occurrence of each symbol to be encoded. The code table indicates correspondence between a symbol and a code that is assigned to the symbol. In entropy coding, a short code is assigned to a symbol having a high frequency of occurrence, and a long code is assigned to a symbol having a low frequency of occurrence. A symbol to be encoded is converted into a variable length code by using the code table.

Compressed data obtained by compression based on the DEFLATE format includes concatenated code words. In a case where the compressed data is decompressed, the code words are decoded into symbols sequentially from the head. In the compressed data, for example, the code length of a first code word is generated, and then a start position of a subsequent second code word is determined. Thus, if it takes a long time period to generate the code length of the first code word, start of decoding of the second code word may be delayed.

BRIEF DESCRIPTION OF THE DRAWINGS

FIG. 4 is a view illustrating an example of a dictionary match length table that indicates relationship among a type of a dictionary match length symbol, an extra bit length, and a dictionary match length and is used in the data decompression device according to the embodiment.

FIG. 8 is a block diagram illustrating an example of a configuration of a code length generation unit in the data decompression device according to the embodiment.

FIG. 9 is a block diagram illustrating an example pf a configuration of a prefix length generation ALU unit in the data decompression device according to the embodiment.

FIG. 10 is a block diagram illustrating an example of a configuration of an extra bit length generation lookup table (LUT) unit in the data decompression device according to the embodiment.

DETAILED DESCRIPTION

Various embodiments will be described hereinafter with reference to the accompanying drawings.

In general, according to one embodiment, a data decompression device decodes a code included in compressed data into a symbol. The data decompression device includes a first code length generation unit and a second code length generation unit. The first code length generation unit generates a first code length of a first code included in the compressed data by arithmetic calculation. The second code length generation unit generates a second code length of a second code by using a table. The second code is included in the compressed data. The second code is subsequent to the first code. The table indicates at least the first code and the second code length that is associated with the first code.

Figure 1:
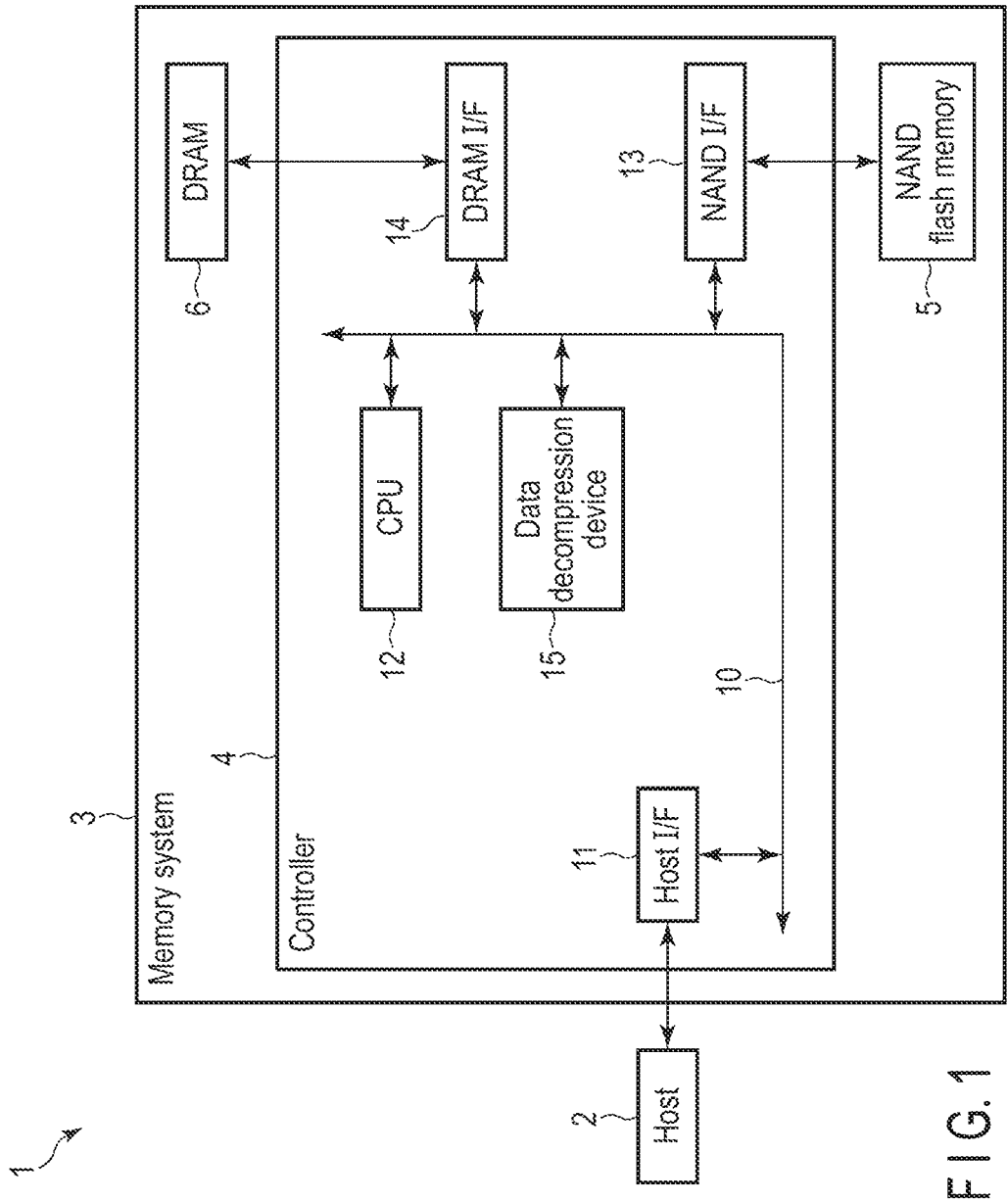
FIG. 1 is a block diagram illustrating an example of a configuration of an information processing system that includes a data decompression device according to an embodiment.

FIG. 1 illustrates an example of a configuration of an information processing system that includes a data decompression device according to an embodiment. The information processing system 1 includes a host device 2 (hereinafter, referred to as a host 2) and a memory system 3.

The memory system 3 is a semiconductor storage device configured to write data to a nonvolatile memory such as a NAND flash memory 5 and read data from the nonvolatile memory. The memory system 3 is implemented, for example, as a solid state drive (SSD) that includes the NAND flash memory 5. Hereinafter, a case where the memory system 3 is implemented as an SSD will be exemplified, but the memory system 3 may be implemented as a hard disk drive (HDD).

The host 2 may be a storage server that stores a large amount of various data in the memory system 3 or may be a personal computer.

The memory system 3 may be used as a storage of the host 2. The memory system 3 may be built in the host 2 or may be connected to the host 2 via a cable or a network.

An interface for connecting the host 2 and the memory system 3 conforms to SCSI, Serial Attached SCSI (SAS), ATA (AT Attachment), Serial ATA (SATA), PCI Express (PCIe) (registered trademark), Ethernet (registered trademark), Fibre channel, NVM Express (NVMe) (registered trademark), and the like.

The memory system 3 includes a controller 4 and the NAND flash memory 5. The controller 4 may be implemented by a circuit such as a system-on-a-chip (SoC).

The memory system 3 may include a random access memory (RAM) that is a volatile memory such as a dynamic random access memory (DRAM) 6. Alternatively, a RAM such as a static random access memory (SRAM) may be built in the controller 4. Note that the DRAM 6 may also be built in the controller 4.

The DRAM 6 is a volatile memory. The RAM such as the DRAM 6 includes, for example, a storage area of firmware (FW) and a cache area of a logical-to-physical address conversion table.

The NAND flash memory 5 includes multiple blocks. Each of the blocks includes multiple pages. The blocks each function as a minimum erase unit. A block may be referred to as an erase block or a physical block. Each of the pages includes multiple memory cells connected to a single word line. The pages each function as a unit of a data write operation and a data read operation. Note that a word line may be used as a unit of a data write operation and a data read operation.

The tolerable maximum number of program/erase cycles (maximum number of P/E cycles) for each of the blocks is limited. One P/E cycle of a block includes an erase operation to erase data stored in all memory cells in the block and a write operation to write data in each page of the block.

The controller 4 includes, for example, a host interface (host I/F) 11, a CPU 12, a NAND interface (NAND I/F) 13, a DRAM interface (DRAM I/F) 14, and a data decompression device 15. The host I/F 11, the CPU 12, the NAND I/F 13, the DRAM I/F 14, and the data decompression device 15 may be mutually connected via a bus 10.

The controller 4 is electrically connected to the NAND flash memory 5 through the NAND I/F 13 that conforms to an interface standard such as a Toggle DDR and an Open NAND Flash Interface (ONFI). The NAND I/F 13 functions as a NAND control circuit configured to control the NAND flash memory 5.

The controller 4 functions as a memory controller configured to control the NAND flash memory 5.

The controller 4 may function as a flash translation layer (FTL) configured to execute data management and block management of the NAND flash memory 5. The data management executed by the FTL includes (1) management of mapping data indicative of relationship between each logical address and each physical address of the NAND flash memory 5 and (2) process to hide a difference between data read operations/data write operations in units of page and data erase operations in units of block. The block management includes management of defective blocks, wear leveling, and garbage collection.

The logical address is an address used by the host 2 for addressing a storage area of the memory system 3. The management of mapping between each logical address and each physical address is executed by using a logical-to-physical address conversion table. The controller 4 manages mapping between each logical address and each physical address in a specific management size unit by using the logical-to-physical address conversion table. A physical address corresponding to a certain logical address indicates a physical memory location in the NAND flash memory 5 to which data of the logical address is written. The logical-to-physical address conversion table may be loaded from the NAND flash memory 5 to the DRAM 6 when the memory system 3 is powered on.

Data write into one page is executable only once in a single P/E cycle. Thus, the controller 4 writes update data corresponding to a logical address not to an original physical memory location in which previous data corresponding to the logical address is stored but to a different physical memory location. Then, the controller 4 updates the logical-to-physical address conversion table to associate the logical address with the different physical memory location and to invalidate the previous data.

The host I/F 11 is a hardware interface that performs communication between the memory system 3 and the host 2 that is an external device of the memory system 3. The host I/F 11 includes a circuit that receives various commands, for example, input/output (I/O) commands and various control commands from the host 2. The I/O commands may include a write command and a read command. The control commands may include an unmap command (trim command) and a format command. The host I/F 11 includes a circuit that transmits to the host 2 a response or data in accordance with a command.

The DRAM I/F 14 functions as a DRAM control circuit configured to control accesses to the DRAM 6.

The CPU 12 is a processor configured to control the host I/F 11, the NAND I/F 13, the DRAM I/F 14, and the data decompression device 15. The CPU 12 performs various types of processing by executing the FW loaded in the DRAM 6. That is, the FW is control programs for controlling the operation of the CPU 12. The CPU 12 may perform, in addition to the above described processes of FTL, command processes to process various commands from the host 2. Note that part of or the entire FTL processes and the command processes may be executed by a dedicated hardware in the controller 4.

The data decompression device 15 decodes one or more code words in a compressed stream (compressed data) read from the NAND flash memory 5 to decompress the compressed stream. For example, the data decompression device 15 decompresses the compressed stream that is read from the NAND flash memory 5 by the controller 4 (more specifically, the CPU 12) in response to reception of a read command from the host 2.

The controller 4 may further include an ECC encoder and an ECC decoder. In this case, the ECC encoder generates a parity for error correction (ECC parity) for a compressed stream output from a data compression device and generates an error correction code word having the generated ECC parity and the compressed stream. Then, the CPU 12 is configured to write the error correction code word into the NAND flash memory 5 via the NAND I/F 13. In this case, when the controller 4 reads data from the NAND flash memory 5 in accordance with, for example, a read command issued from the host 2, the CPU 12 reads an error correction code word from the NAND flash memory 5 via the NAND I/F 13, and the ECC decoder executes error detection processing and error correction processing on the read error correction code word to generate a compressed stream. Then, the data decompression device 15 is configured to decompress the generated compressed stream. That is, the controller 4 may be configured to write, into the NAND flash memory 5, data based on the compressed stream output from the data compression device, generate the compressed stream based on the data read from the NAND flash memory 5, and decompress the generated compressed stream.

Hereinafter, a case where a compression scheme used to generate a compressed stream is a scheme based on the DEFLATE format (RFC1951) will be exemplified. In the compression scheme based on the DEFLATE format, entropy coding is performed on a symbol obtained as a result of lexicographic coding.

In the lexicographic coding, a history buffer that stores data (for example, a character symbol string) input in the past is used. In the lexicographic coding, the history buffer is searched to obtain past data at least partially matching data to be compressed, and a pair of a dictionary match distance and a dictionary match length is obtained. The dictionary match distance indicates a distance to a position where the acquired past data is stored in the history buffer. The dictionary match distance is represented by a dictionary match distance symbol. The dictionary match length indicates the length of a portion of match between the acquired past data and the data to be compressed. The dictionary match length is represented by a dictionary match length symbol (ML). Since the data to be compressed is converted into the pair of the dictionary match distance and the dictionary match length, the data can be compressed.

Note that, in the lexicographic coding, in a case where any portion of the data to be compressed does not match the data in the history buffer, a symbol included in the data to be compressed is output as it is as a dictionary mismatch symbol (literal: L).

In the DEFLATE format, 286 types of symbols that include 257 types of dictionary mismatch symbols and 29 types of dictionary match length symbols are represented by a series of code indexes (for example, code indexes from 0 to 285). 30 types of dictionary match distance symbols are represented by another set of code indexes (for example, code indexes from 0 to 29). Note that each of the symbols (each of the code indexes) is data of a fixed length.

The entropy coding is further performed on the dictionary mismatch symbol and the dictionary match length symbol obtained by the lexicographic coding. The entropy coding is further performed on the dictionary match distance symbol obtained by the lexicographic coding. The entropy coding is a variable length coding scheme. The entropy coding is, for example, dynamic Huffman coding.

In the entropy coding, a code table is dynamically generated on the basis a frequency of occurrence of each symbol to be encoded. The code table includes, for example, information indicating a symbol and a code assigned to the symbol for each of all types of symbols that occur in data to be encoded. In the entropy coding, a short code is assigned to a symbol having a high frequency of occurrence, and a long code is assigned to a symbol having a low frequency of occurrence. A symbol to be encoded is converted into a code by using the code table. The code obtained by the conversion is a variable length code and is a prefix code. The prefix code is a code that is assigned to one symbol and is not a prefix of a code assigned to another symbol. In other words, in a case where a bit string to be decoded includes prefix codes, while the bit string to be decoded is sequentially read bit by bit from the head without reading the entire bit string to be decoded at one time, codes each corresponding to a bit string of the read one or more bits are sequentially identified. Thus, the identified codes can be sequentially decoded. The prefix code is also referred to as a prefix.

In the compressed data, a code word corresponding to a dictionary mismatch symbol is composed of a code of a first type. A code word corresponding to a dictionary match length symbol is composed of a code of the first type or is composed of a code of the first type and a code of a second type. A code word corresponding to a dictionary match distance symbol is composed of a code of the first type or is composed of a code of the first type and a code of the second type. The code of the first type is a prefix. The code of the second type is extra bits. The extra bits are a code (bit string) of one or more bits that is used to identify a corresponding dictionary match length or dictionary match distance. That is, a dictionary match length is identified by a dictionary match length symbol corresponding to a prefix or is identified by a dictionary match length symbol corresponding to a prefix and a value of extra bits. In addition, a dictionary match distance is identified by a dictionary match distance symbol corresponding to a prefix or is identified by a dictionary match distance symbol corresponding to a prefix and a value of extra bits.

Hereinafter, in order to make the description easy to understand, an operation in a case of decoding code words of dictionary mismatch symbols and code words of dictionary match length symbols included in the compressed stream will be mainly exemplified. Note that this operation is also applicable to an operation of decoding code words of dictionary match distance symbols included in the compressed stream.

Figure 2:
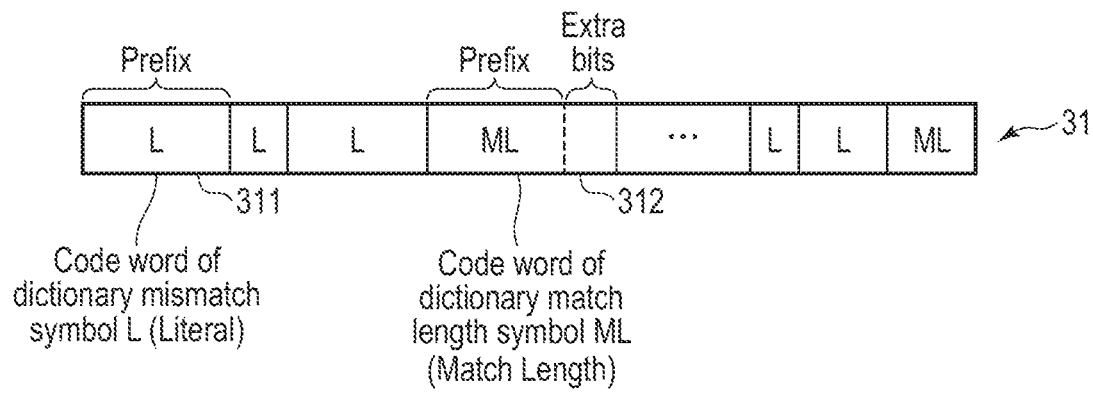
FIG. 2 is a view illustrating an example of code words in a compressed stream to be decompressed in the data decompression device according to the embodiment.

FIG. 2 illustrates an example of code words in a compressed stream 31 to be decompressed in the data decompression device 15. The compressed stream 31 includes, for example, a code word 311 corresponding to a dictionary mismatch symbol (L) and a code word 312 corresponding to a dictionary match length symbol (ML).

As illustrated in FIG. 2, the code word 311 corresponding to the dictionary mismatch symbol is composed of a prefix. The code word 312 corresponding to the dictionary match length symbol may be composed of a prefix and extra bits. Each prefix is a variable length code.

In the compressed stream 31 including variable length codes, a start position of a certain code word depends on the length (code length) of a code word preceding the certain code word. Thus, code words included in the compressed stream 31 need to be sequentially decoded from the code word at the head of the compressed stream 31. In the compressed stream 31, for example, the code length of a first code word is generated, and then a start position of a second code word subsequent to the first code word is determined. Thus, if it takes a long time period to generate the code length of the first code word, start of decoding of the second code word may be delayed. Thus, generation of code lengths tends to be a bottleneck (critical path) in speeding up of processing of decoding code words in the compressed stream 31.

A code length generation method differs depending on a type of a symbol corresponding to a code word. More specifically, the code length of a code word corresponding to a dictionary mismatch symbol is the length of a prefix (prefix length). The code length of a code word corresponding to a dictionary match length symbol is the sum of the length of a prefix and the length of extra bits (extra bit length).

Here, the length of a prefix will be described.

Figure 3:
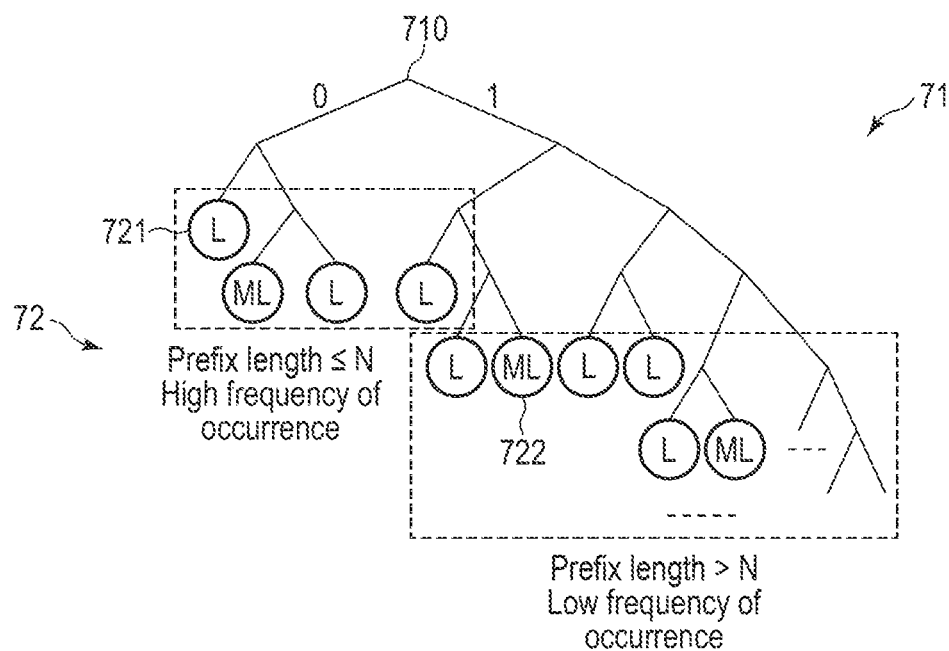
FIG. 3 is a view illustrating an example of a Huffman tree that expresses codes (prefixes) assigned to dictionary mismatch symbols and dictionary match length symbols and is used in the data decompression device according to the embodiment.

FIG. 3 illustrates an example of a Huffman tree 71 that expresses prefixes assigned to dictionary mismatch symbols and prefixes assigned to dictionary match length symbols. The prefixes assigned to the dictionary mismatch symbols and the prefixes assigned to the dictionary match length symbols are expressed by the common Huffman tree 71.

Each leaf node 72 of the Huffman tree 71 corresponds to either a dictionary mismatch symbol or a dictionary match length symbol. The depth of each leaf node 72 starting from a root node 710 of the Huffman tree 71 (that is, the number of edges traced from the root node 710 to the leaf node 72) corresponds to the length of a prefix assigned to a corresponding symbol.

For example, a leaf node 721 corresponds to a dictionary mismatch symbol. A prefix "00" is assigned to the dictionary mismatch symbol corresponding to the leaf node 721. The length of the prefix is two.

Further, for example, a leaf node 722 corresponds to a dictionary match length symbol. A prefix "1011" is assigned to the dictionary match length symbol corresponding to the leaf node 722. The length of the prefix is four.

As described above, a prefix is a variable length code obtained by the entropy coding. Thus, the length of a prefix becomes shorter as a frequency of occurrence of a corresponding symbol is higher. In other words, the length of the prefix becomes longer as the frequency of occurrence of the corresponding symbol is lower.

Next, the length of extra bits will be described.

The extra bits are a code that may be included in a code word corresponding to a dictionary match length symbol. In other words, the extra bits are a code that may be added to a prefix corresponding to the dictionary match length symbol. The length of the extra bits is determined based on a type of the corresponding dictionary match length symbol.

FIG. 4 illustrates an example of a dictionary match length table 37 that indicates relationship among a type of a dictionary match length symbol, an extra bit length, and a dictionary match length. This relationship is defined in the DEFLATE format, for example. In the DEFLATE format, types of dictionary mismatch symbols and dictionary match length symbols are represented by code indexes from 0 to 285. More specifically, the code indexes 0 to 256 indicate 257 types of dictionary mismatch symbols, respectively. The code indexes 257 to 285 indicate 29 types of dictionary match length symbols, respectively.

Accordingly, FIG. 4 illustrates the code indexes (codes) from 257 to 285 that indicate the 29 types of dictionary match length symbols, respectively. Further, an extra bit length and a dictionary match length that correspond to each of the 29 types of dictionary match length symbols are indicated.

For example, an extra bit length corresponding to a dictionary match length symbol whose code index is 257 is 0 bits. A dictionary match length corresponding to this dictionary match length symbol is three. This dictionary match length symbol indicates a single dictionary match length, and thus, a corresponding code word does not include extra bits.

Further, for example, an extra bit length corresponding to a dictionary match length symbol whose code index is 265 is 1 bit. In other words, a code word corresponding to this dictionary match symbol includes a prefix and the extra bits of 1 bit. A dictionary match length corresponding to this dictionary match length symbol is either 11 or 12. A value of the extra bits whose length is 1 bit indicates 0 or 1. For example, in a case where the value of extra bits is 0, the dictionary match length is 11. In a case where the value of the extra bits is 1, the dictionary match length is 12.

As described above, for example, in the DEFLATE format, the dictionary match length table 37 that indicates the relationship among a type of a dictionary match length symbol, an extra bit length, and a dictionary match length is defined. Thus, by using the dictionary match length table 37, an extra bit length and a dictionary match length corresponding to a certain dictionary match length symbol can be identified. Similarly, for example, in the DEFLATE format, a relationship among a type of a dictionary match distance symbol, an extra bit length, and a dictionary match distance (i.e., dictionary match distance table) is defined. Thus, by using the dictionary match distance table, an extra bit length and a dictionary match distance that correspond to a certain dictionary match distance symbol can be identified.

The data decompression device 15 decompresses, for example, the compressed stream 31 including a code word corresponding to a dictionary mismatch symbol and a code word corresponding to a dictionary match length symbol. In the compressed stream 31, a start position of a certain code word depends on the length of a code word preceding the certain code word. In a case where a code word corresponds to a dictionary mismatch symbol, the length of a prefix included in the code word is generated as a code length. On the other hand, in a case where a code word corresponds to a dictionary match length symbol, for example, the length of a prefix included in the code word is generated, the length of extra bits is obtained on the basis of the result of decoding the prefix, and a code length is generated by adding the length of the prefix and the length of the extra bits. Thus, a path for generating the code length of a code word corresponding to a dictionary match length symbol tends to be a critical path for determining decoding throughput.

As one of methods for speeding up generation of a code length, there is a possible method using a lookup table (LUT) that outputs a code length corresponding to an input prefix. However, in this method, since it is necessary for the LUT to include information on code lengths that correspond to all types of prefixes, respectively, a circuit area of the LUT becomes larger.

Thus, in the data decompression device 15 according to the present embodiment, generation of a code length of a code word corresponding to a dictionary match length symbol is speeded up without increasing the circuit area. As a result, the decoding throughput can be improved.

Figure 5:
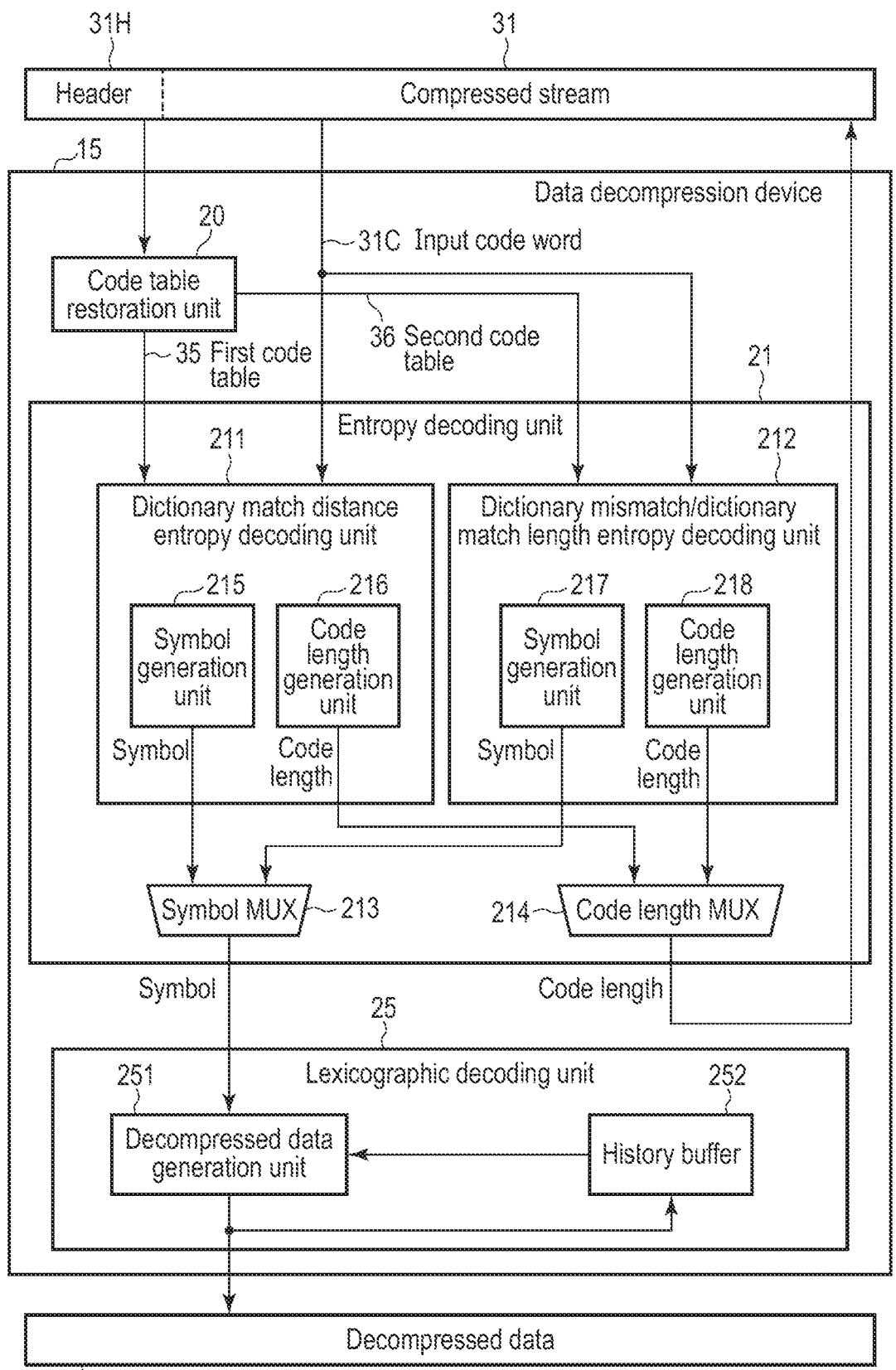
FIG. 5 is a block diagram illustrating an example of a configuration of the data decompression device according to the embodiment.

FIG. 5 is a block diagram illustrating an example of a configuration of the data decompression device 15. The data decompression device 15 decompresses the input compressed stream 31 to acquire decompressed data 32. The data decompression device 15 includes, for example, a code table restoration unit 20, an entropy decoding unit 21, and a lexicographic decoding unit 25. The entropy decoding unit 21 includes a dictionary match distance entropy decoding unit 211, a dictionary mismatch/dictionary match length entropy decoding unit 212, a symbol multiplexer (MUX) 213, and a code length MUX 214. The lexicographic decoding unit 25 includes a decompressed data generation unit 251 and a history buffer 252.

(Code Table Restoration Unit)

The code table restoration unit 20 generates (restores) a code table 35 (hereinafter, referred to as a first code table 35) of dictionary match distance symbols and a code table 36 (hereinafter, referred to as a second code table 36) of dictionary mismatch symbols and dictionary match length symbols by using a header 31H of the compressed stream 31. The first code table 35 includes information indicative of a dictionary match distance symbol and a code (that is, a prefix) that is assigned to the dictionary match distance symbol. The symbol is represented by, for example, a code index. The second code table 36 includes (1) information indicative of a dictionary mismatch symbol and a code that is assigned to the dictionary mismatch symbol, and (2) information indicative of a dictionary match length symbol and a code that is assigned to the dictionary match length symbol.

The header 31H includes, for example, data (first code table compressed data) obtained by compressing a plurality of code lengths that correspond to a plurality of dictionary match distance symbols, respectively, and data (second code table compressed data) obtained by compressing a plurality of code lengths that correspond to a plurality of dictionary mismatch symbols and dictionary match length symbols, respectively. The first code table compressed data is, for example, data obtained by sorting the code lengths respectively corresponding to the dictionary match distance symbols in a specific symbol order, performing run-length encoding on the sorted code lengths, and further performing Huffman encoding on the result of the run-length encoding. The second code table compressed data is, for example, data obtained by sorting the code lengths respectively corresponding to the dictionary mismatch symbols and dictionary match length symbols in the specific symbol order, performing the run-length encoding on the sorted code lengths, and further performing the Huffman encoding on the result of the run-length encoding. The specific symbol order is, for example, an order conforming to corresponding symbols in an alphabetical order. In other words, the code lengths sorted in the specific symbol order is, for example, code lengths sorted so as to respectively correspond to the symbols that are sorted in the alphabetical order.

The code table restoration unit 20 decompresses the first code table compressed data, thereby acquiring the code lengths that correspond to the dictionary match distance symbols and are sorted in the specific symbol order. The code table restoration unit 20 generates the first code table 35 by using the acquired code lengths. The code table restoration unit 20 generates the first code table 35 according to, for example, canonical Huffman coding. The canonical Huffman coding is capable of determining a code bit string (variable length code) to be assigned to each of symbols by using only the code lengths of the symbols. The canonical Huffman coding is adopted as an entropy coding of the DEFLATE format. The code table restoration unit 20 sends the generated first code table 35 to the dictionary match distance entropy decoding unit 211.

The code table restoration unit 20 decompresses the second code table compressed data, thereby acquiring the code lengths that correspond to the dictionary mismatch symbols and dictionary match length symbols and are sorted in the specific symbol order. The code table restoration unit 20 generates the second code table 36 by using the acquired code lengths. The code table restoration unit 20 generates the second code table 36 according to, for example, the canonical Huffman coding. The code table restoration unit 20 sends the generated second code table 36 to the dictionary mismatch/dictionary match length entropy decoding unit 212.

(Entropy Decoding Unit)

The entropy decoding unit 21 performs entropy decoding on an input code word 31C acquired from the compressed stream 31. Accordingly, the entropy decoding unit 21 obtains a symbol and a code length that correspond to the input code word 31C.

More specifically, the dictionary match distance entropy decoding unit 211 performs entropy decoding on the input code word 31C that is acquired from the compressed stream 31 and corresponds to a dictionary match distance symbol. The dictionary match distance entropy decoding unit 211 includes a symbol generation unit 215 and a code length generation unit 216.

The symbol generation unit 215 converts the input code word 31C into a dictionary match distance symbol by using the first code table 35. The symbol generation unit 215 sends the dictionary match distance symbol obtained by the conversion to the symbol MUX 213. A value of corresponding extra bits may be added to the sent dictionary match distance symbol.

The code length generation unit 216 generates a code length of the input code word 31C. In a case where the input code word 31C is composed of a prefix, the code length generation unit 216 generates the length of the prefix as the code length. In a case where the input code word 31C is composed of a prefix and extra bits, the code length generation unit 216 adds the length of the extra bits to the length of the prefix, thereby generating the code length. The length of the extra bits is obtained by using, for example, the first code table 35 and the above-described dictionary match distance table. The code length generation unit 216 sends the generated code length to the code length MUX 214.

The dictionary mismatch/dictionary match length entropy decoding unit 212 performs entropy decoding on the code word 31C that is included in the compressed stream 31 and corresponds to a dictionary mismatch symbol or a dictionary match length symbol. The dictionary mismatch/dictionary match length entropy decoding unit 212 includes a symbol generation unit 217 and a code length generation unit 218.

The symbol generation unit 217 converts the input code word 31C into one of the dictionary mismatch symbol and the dictionary match length symbol by using the second code table 36. The symbol generation unit 217 sends the dictionary mismatch symbol or the dictionary match length symbol obtained by the conversion to the symbol MUX 213. A value of corresponding extra bits may be added to the sent dictionary match length symbol.

The code length generation unit 218 generates a code length of the input code word 31C. In a case where the input code word 31C is composed of a prefix, the code length generation unit 218 generates the length of the prefix as the code length. In a case where the input code word 31C is composed of a prefix and extra bits, the code length generation unit 218 adds the length of the extra bits to the length of the prefix, thereby generating the code length. The length of the extra bits is acquired by using, for example, the second code table 36 and the above-described dictionary match length table 37. The code length generation unit 218 sends the generated code length to the code length MUX 214.

The symbol MUX 213 sends the dictionary match distance symbol received from the dictionary match distance entropy decoding unit 211 to the lexicographic decoding unit 25 (more specifically, the decompressed data generation unit 251). The symbol MUX 213 sends the dictionary mismatch symbol or the dictionary match length symbol received from the dictionary mismatch/dictionary match length entropy decoding unit 212 to the lexicographic decoding unit 25.

The code length MUX 214 sends the code length received from the dictionary match distance entropy decoding unit 211 or the dictionary mismatch/dictionary match length entropy decoding unit 212 to each unit that acquires input code words 31C from the compressed stream 31. Each unit that acquires input code words 31C from the compressed stream 31 is, for example, the dictionary match distance entropy decoding unit 211 and the dictionary mismatch/dictionary match length entropy decoding unit 212. Accordingly, the dictionary match distance entropy decoding unit 211 and the dictionary mismatch/dictionary match length entropy decoding unit 212 can determine a start position of an input code word 31C to be decoded next in the compressed stream 31 by using the code length.

Note that in a case where a certain input code word 31C (first code word) is decoded into a dictionary mismatch symbol, an input code word 31C (second code word) to be decoded next is a code word to be decoded into a dictionary mismatch symbol or a dictionary match length symbol.

Thus, the dictionary mismatch/dictionary match length entropy decoding unit 212 determines a start position of the second code word in the compressed stream 31 by using the code length of the first code word and decodes the second code word into a dictionary mismatch symbol or a dictionary match length symbol.

In a case where the first code word is decoded into a dictionary match length symbol, the second code word is a code word to be decoded into a dictionary match distance symbol. Thus, the dictionary match distance entropy decoding unit 211 determines a start position of the second code word in the compressed stream 31 by using the code length of the first code word and decodes the second code word into a dictionary match distance symbol. In other words, a pair of the dictionary match length and the dictionary match distance is generated from the dictionary match length symbol corresponding to the first code word and the dictionary match distance symbol corresponding to the subsequent second code word.

In a case where the first code word is decoded into a dictionary match distance symbol, the second code word is a code word to be decoded into a dictionary mismatch symbol or a dictionary match length symbol. Thus, the dictionary mismatch/dictionary match length entropy decoding unit 212 determines a start position of the second code word in the compressed stream 31 by using the code length of the first code word and decodes the second code word into a dictionary mismatch symbol or a dictionary match length symbol.

(Lexicographic Decoding Unit)

The lexicographic decoding unit 25 decodes the dictionary match symbol, the dictionary match length symbol, and the dictionary match distance symbol sent by the entropy decoding unit 212 (more specifically, the symbol MUX 213), thereby generating the decompressed data 32. Values of corresponding extra bits may be added to the dictionary match length symbol and the dictionary match distance symbol, respectively.

Specifically, the decompressed data generation unit 251 outputs, as the decompressed data 32, the dictionary mismatch symbol as it is and stores the dictionary mismatch symbol in the history buffer 252.

In addition, the decompressed data generation unit 251 reads a symbol string from the history buffer 252 on the basis of a pair of a dictionary match length corresponding to the dictionary match length symbol and a dictionary match distance corresponding to the dictionary match distance symbol. Then, the decompressed data generation unit 251 outputs the read symbol string as the decompressed data 32.

With the above configuration, the data decompression device 15 can generate the decompressed data 32 from the compressed stream 31.

Here, in order to describe the speed-up of code length generation in the data decompression device 15 according to the present embodiment, code length generation in a data decompression device according to a comparative example will be described.

Comparative Example

Figure 6:
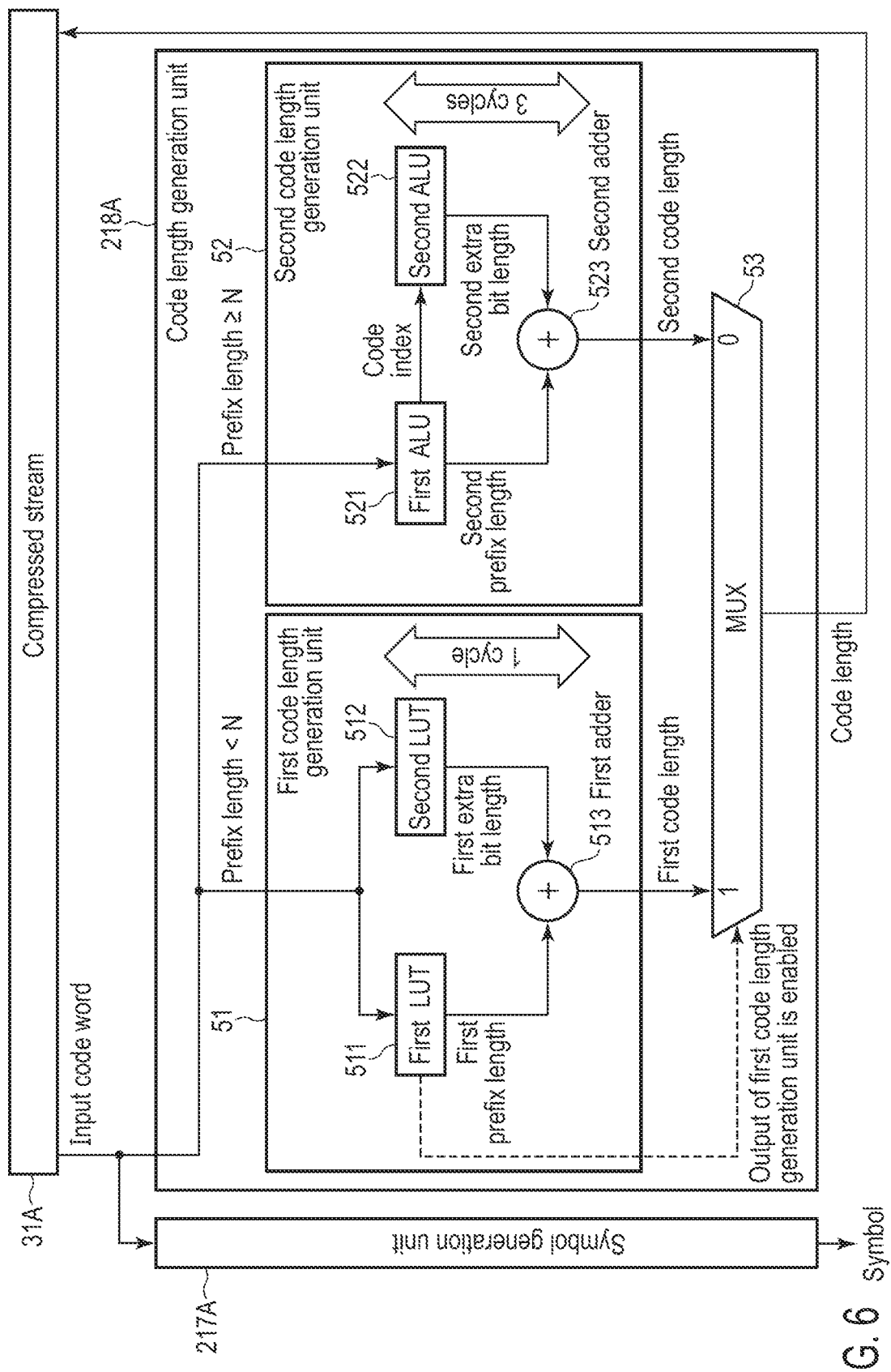
FIG. 6 is a block diagram illustrating a configuration of a code length generation unit in a data decompression device according to a comparative example.

FIG. 6 is a block diagram illustrating a configuration of a code length generation unit in the data decompression device according to the comparative example. In the data decompression device according to the comparative example, a code length generation unit 218A generates a code length of a code word (input code word) acquired from a compressed stream 31A. In addition, a symbol generation unit 217A converts the code word acquired from the compressed stream 31A into a symbol. The symbol generation unit 217A converts a code word into a symbol, for example, similarly to the symbol generation unit 217 (or the symbol generation unit 215) in the data decompression device 15 according to the present embodiment. Hereinafter, a case where the code length generation unit 218A generates a code length of a code word corresponding to either a dictionary mismatch symbol or a dictionary match length symbol will be exemplified.

The code length generation unit 218A includes a first code length generation unit 51, a second code length generation unit 52, and an MUX 53. The first code length generation unit 51 generates a code length (hereinafter, referred to as a first code length) of the input code word when a prefix length is shorter than N bits. The second code length generation unit 52 generates a code length (hereinafter, referred to as a second code length) of the input code word when the prefix length is equal to or longer than N bits. The MUX 53 sends the first code length or the second code length. By using the sent first code length or second code length, a start position of a code word to be decoded next is determined in the compressed stream 31A.

More specifically, the first code length generation unit 51 includes a first LUT 511, a second LUT 512, and a first adder 513.

The first LUT 511 sends the length (first prefix length) of a prefix that matches the input code word to the first adder 513. The first LUT 511 is constructed by using, for example, the second code table 36 of dictionary mismatch symbols and dictionary match length symbols. Specifically, the first LUT 511 includes entries each indicating a prefix whose length is shorter than N bits and the length of the prefix. The first LUT 511 sends, to the MUX 53, an enable signal of output of the first code length generation unit indicating that there is a prefix whose length is shorter than N bits that matches the input code word. When not storing the prefix that matches the input code word, the first LUT 511 does not send the first prefix length and the enable signal of output of the first code length generation unit.

The second LUT 512 sends the length (first extra bit length) of extra bits that is associated with the prefix that matches the input code word to the first adder 513. The second LUT 512 is constructed by using, for example, the second code table 36 and the dictionary match length table 37. Specifically, the second LUT 512 includes entries each indicating a prefix whose length is shorter than N bits and an extra bit length corresponding to the prefix. When not storing the prefix that matches the input code word, the second LUT 512 does not send the first extra bit length.

The first adder 513 adds the first prefix length and the first extra bit length, thereby obtaining a code length (first code length) of the input code word. The first adder 513 sends the first code length to the MUX 53. Note that in a case where the first prefix length is sent from the first LUT 511 and the first extra bit length is not sent from the second LUT 512, the first adder 513 sends the first prefix length as the first code length to the MUX 53.

The second code length generation unit 52 includes a first arithmetic logic unit (ALU) 521, a second ALU 522, and a second adder 523.

The first ALU 521 calculates the length (second prefix length) of a prefix that matches the input code word. In addition, the first ALU 521 decodes the prefix that matches the input code word and generates a code index representing a corresponding symbol. For example, the second code table 36 is used to calculate the second prefix length and generate the code index. The first ALU 521 sends the calculated second prefix length to the second adder 523. The first ALU 521 sends the generated code index to the second ALU 522.

The second ALU 522 calculates the length (second extra bit length) of extra bits corresponding to the code index on the basis of the code index received from the first ALU 521. For example, the dictionary match length table 37 is used to calculate the second extra bit length. The second ALU 522 sends the calculated second extra bit length to the second adder 523. Note that in a case where the code index corresponds to a dictionary mismatch symbol, the second ALU 522 does not send the second extra bit length or sends 0 as the second extra bit length.

The second adder 523 adds the second prefix length and the second extra bit length, thereby calculating the code length (second code length) of the input code word. The second adder 523 sends the second code length to the MUX 53. Note that in a case where the second prefix length is sent from the first ALU 521 and the second extra bit length is not sent from the second ALU 522, the second adder 523 sends the second prefix length as the second code length to the MUX 53.

The MUX 53 sends one of the first code length and the second code length as the code length of the input code word according to presence or absence of input of the enable signal of output of the first code length generation unit. Specifically, in a case where the enable signal of output of the first code length generation unit is input (for example, in a case where the enable signal of output of the first code length generation unit=1), the MUX 53 sends the first code length. In a case where the enable signal of output of the first code length generation unit is not input (for example, in a case where the enable signal of output of the first code length generation unit=0), the MUX 53 sends the second code length. Each unit that acquires input code words from the compressed stream 31A can determine a start position of an input code word to be decoded next in the compressed stream 31 by using the sent code length.

As described above, in the data decompression device according to the comparative example, the first code length generated by the first code length generation unit 51 in a case where the length of the prefix is less than N bits is obtained by reading entries of the prefix that matches the input code word (that is, the first prefix length and the first extra bit length) from the first LUT 511 and the second LUT 512, respectively, and adding the entries.

On the other hand, the second code length generated by the second code length generation unit 52 in a case where the length of the prefix is N bits or more is obtained by procedure of (1) calculating the length (second prefix length) of the prefix that matches the input code word, (2) decoding the prefix that matches the input code word and acquiring the code index, (3) calculating an extra bit length (second extra bit length) based on the code index, and (4) adding the second prefix length and the second extra bit length. Thus, a path through which the second code length generation unit 52 generates the second code length is a path with a long delay time until the code length is generated.

As described above, in the compressed stream including variable length codes, a start position of a certain code word depends on the length (code length) of a code word preceding the certain code word. Thus, throughput of the whole of decoding processing performed on the compressed stream is controlled according to throughput of code length generation.

In the data decompression device according to the comparative example, for example, the first code length generation unit 51 generates the first code length in one cycle, whereas the second code length generation unit 52 generates the second code length in three or more cycles. In other words, in a case where a prefix length is less than N bits, throughput of the code length generation becomes throughput in which one code word is processed (that is, one code length is generated) in one cycle, whereas in a case where a prefix length is N bits or more, throughput of the code length generation decreases to throughput in which one code word is processed in three or more cycles.

Figure 7:
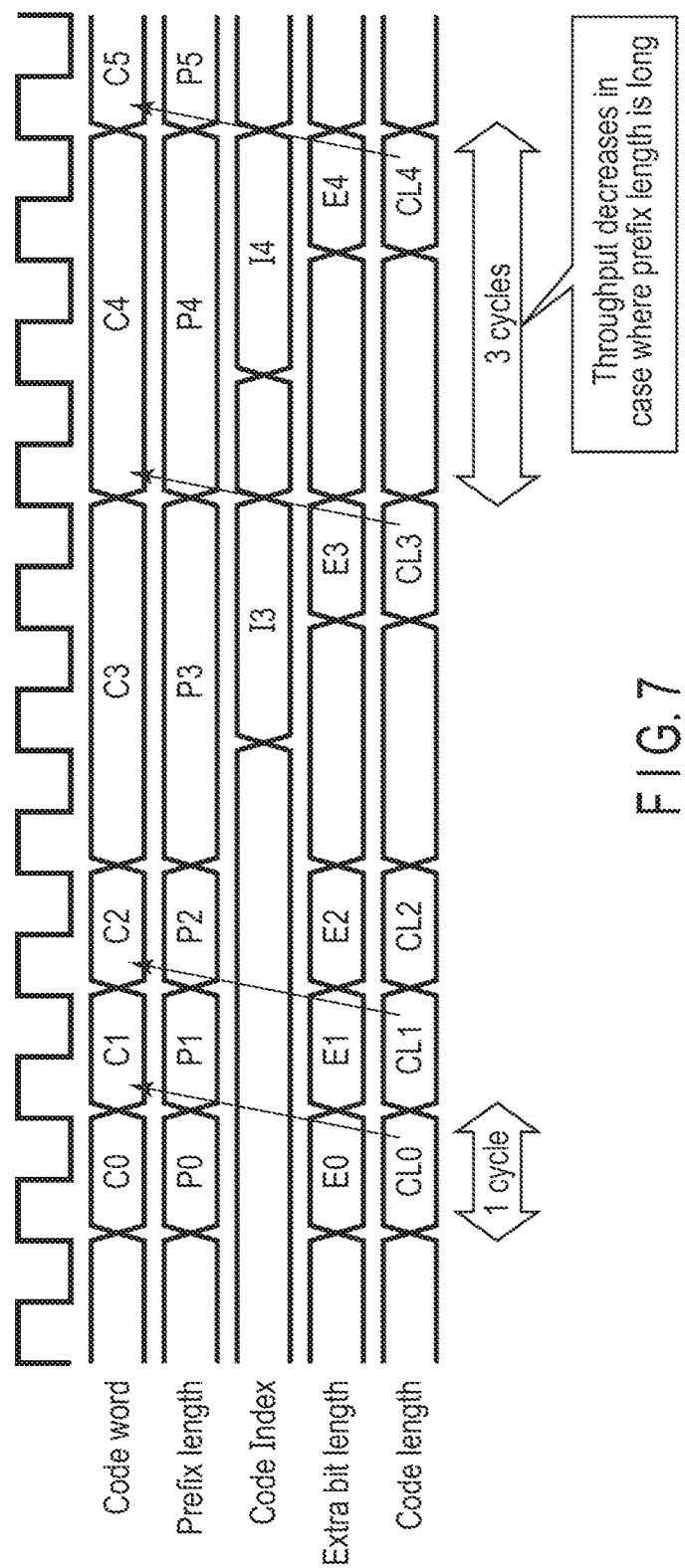
FIG. 7 is a view illustrating a timing chart related to code length generation in the data decompression device according to the comparative example.

FIG. 7 illustrates a timing chart related to the code length generation in the data decompression device according to the comparative example. It is assumed here that each of code words C0, C1, and C2 includes a prefix whose length is less than N bits, and each of code words C3 and C4 includes a prefix whose length is N bits or more. N is, for example, ten.

As illustrated in FIG. 7, code lengths CL0, CLM, and CL2 are each generated within one cycle for the respective code words C0, C1, and C2. Specifically, for example, an operation of acquiring a prefix length P0 and an extra bit length EQ and generating the code length CL0 for the code word C0 is performed within one cycle.

In contrast, for each of the code words C3 and C4, the code lengths CL3 and CL4 are each generated in three cycles. Specifically, for example, for the code word C4, three cycles are required for an operation of acquiring a prefix length P4 and an operation of acquiring an extra bit length E4 based on a code index 14 after decoding a prefix to acquire the code index 14.

As described above, the throughput in which one code word is processed in one cycle is obtained for the code words C0, C1, and C2, whereas the throughput in which one code word is processed in three or more cycles is obtained for the code words C3 and C4. Thus, in the data decompression device according to the comparative example, in a case where a prefix length is N bits or more, the throughput of code length generation decreases, and thus, high throughput in decoding cannot be guaranteed.

In the data decompression device 15 according to the present embodiment, generation of a code length is speeded up without increasing the circuit area. As a result, the decoding throughput can be improved.

A configuration for speeding up code length generation in the data decompression device 15 will be described with reference to FIGS. 8 to 10.

FIG. 8 is a block diagram illustrating an example of a configuration of the code length generation unit 218 in the data decompression device 15. Here, the example of the configuration of the code length generation unit 218 in the dictionary mismatch/dictionary match length entropy decoding unit 212 will be described, but the code length generation unit 216 in the dictionary match distance entropy decoding unit 211 may also be implemented with a similar configuration. The operation of the symbol generation unit 217 is as described above with reference to FIG. 5.

The code length generation unit 218 includes a prefix length generation ALU unit 221, an extra bit length generation LUT unit 222, and an adder 223.

The prefix length generation ALU unit 221 generates the length (prefix length) of a prefix included in an input code word by arithmetic calculation. The prefix length generation ALU unit 221 generates the length of the prefix with a low delay, for example, by utilizing a fact that the prefix is a canonical Huffman code. The prefix length generation ALU unit 221 generates the prefix length without performing an operation of decoding the prefix (that is, an operation of converting the prefix into a code index). This enables the prefix length generation ALU unit 221 to generate the prefix length with a low delay. The prefix length generation ALU unit 221 sends the generated prefix length to the adder 223.

The extra bit length generation LUT unit 222 generates an extra bit length that corresponds to the prefix included in the input code word. When not storing the prefix that matches the input code word, the extra bit length generation LUT unit 222 does not generate an extra bit length or generates 0 as an extra bit length. The extra bit length generation LUT unit 222 sends the generated extra bit length to the adder 223.

The adder 223 adds the prefix length and the extra bit length, thereby obtaining the code length of the input code word. Note that in a case where the prefix length is sent from the prefix length generation ALU unit 221 and the extra bit length is not sent from the extra bit length generation LUT unit 222, the adder 223 acquires the prefix length as the code length.

Here, extra bit lengths stored by the extra bit length generation LUT unit 222 will be described.

For example, in the DEFLATE format, the 257 types of dictionary mismatch symbols and the 29 types of dictionary match length symbols are defined. As illustrated in the dictionary match length table 37 of FIG. 4, the 29 types of dictionary match length symbols are represented by the code indexes from 257 to 285, respectively. Among the 29 types of dictionary match length symbols, there are 20 types of dictionary match length symbols to which extra bits of 1 bit or more is added. The 20 types of dictionary match length symbols to which extra bits of 1 bit or more is added are represented by code indexes from 265 to 284, respectively.

In this case, the extra bit length generation LUT unit 222 stores at most 20 extra bit lengths that correspond to the 20 types of dictionary match length symbols, respectively. Thus, cost of the circuit area to implement generation of the extra bit lengths by an LUT is low.

On the other hand, for example, the first LUT 511 in the data decompression device according to the comparative example stores the prefix lengths less than N bits without distinction between dictionary mismatch symbols and dictionary match length symbols. In addition, the second LUT 512 stores extra bit lengths that correspond to respective prefixes each having a prefix length less than N bits without distinction between the dictionary mismatch symbols and the dictionary match length symbols. Thus, in the data decompression device of the comparative example, there is a trade-off that while throughput of decoding (more specifically, code length generation) is improved as N is made greater, the circuit area increases. Thus, in the data decompression device of the comparative example, there is a possibility that the circuit area increases in order to improve the throughput of decoding.

In the data decompression device 15 according to the present embodiment, the code length can be generated with a low delay without increasing the circuit area and without distinction between the dictionary mismatch symbols and the dictionary match length symbols. That is, high throughput in decoding can be guaranteed without increasing the circuit area.

FIG. 9 is a block diagram illustrating an example of a configuration of the prefix length generation ALU unit 221 in the data decompression device 15. The prefix length generation ALU unit 221 includes, for example, a prefix list 231, one or more range check units 232-1 to 232-4, and a One-Hot-Dec unit 233.

The prefix list 231 corresponds to, for example, all prefixes that are included in the second code table 36. Each of the prefixes included in the second code table 36 is a variable length code that is assigned to either a dictionary mismatch symbol or a dictionary match length symbol according to, for example, the canonical Huffman coding. A plurality of variable length codes (hereinafter, also referred to as canonical Huffman codes) that are assigned to a plurality of dictionary mismatch symbols and dictionary match length symbols, respectively, according to the canonical Huffman coding have property of being arranged in order from a code having a shorter code length in a case where the codes are regarded as numerical values and are arranged on a number line. Each input code word includes a prefix that is a canonical Huffman code. Thus, the length of the prefix can be determined depending on whether or not a range in the prefix list 231 from a first prefix (that is, a minimum value) to a last prefix (that is, a maximum value) that corresponds to a prefix length of x bits includes a portion of x bits (that is, a portion corresponding to the prefix) from the head of the input code word.

In the example illustrated in FIG. 9, the prefix list 231 includes a prefix "00" having a prefix length of 2 bits, prefixes "010", "011", and "100" each having a prefix length of 3 bits, prefixes "1000", "1011", "1100", and "1101" each having a prefix length of 4 bits, and a prefix "11100" having a prefix length of 5 bits.

Each of the range check units 232-1 to 232-4 determines whether or not a range in the prefix list 231 from a first prefix to a last prefix that corresponds to a prefix length of x bits includes a portion of x bits from the head of the input code word. The range from a first prefix to a last prefix that corresponds to the prefix length of x bits is referred to as an x bit prefix range. Each of the range check units 232-1 to 232-4 sends the determination result to the One-Hot-Dec unit 233.

The One-Hot-Dec unit 233 outputs the prefix length corresponding to the prefix range that includes the input code word by using the determination result obtained from each of the range check units 232-1 to 232-4.

Here, an example of generating a prefix length corresponding to an input code word "1011 . . . " by using the prefix list 231 illustrated in FIG. 9 will be specifically described.

The range check unit 232-1 determines whether a range from a first prefix "00" to a last prefix "00" corresponding to a prefix length of 2 bits includes an input code word "10" of 2 bits. In this case, only the prefix "00" has a prefix length of 2 bits, and thus, both the first prefix and the last prefix are the prefix "00". The range check unit 232-1 sends a determination result indicating that the 2-bit prefix range does not include the input code word "10" to the One-Hot-Dec unit 233.

The range check unit 232-2 determines whether a range from a first prefix "010" to a last prefix "100" corresponding to a prefix length of 3 bits includes an input code word "101" of 3 bits. The range check unit 232-2 sends a determination result indicating that the 3-bit prefix range does not include the input code word "101" to the One-Hot-Dec unit 233.

The range check unit 232-3 determines whether a range from a first prefix "1010" to a last prefix "1101" corresponding to a prefix length of 4 bits includes an input code word "1011" of 4 bits. The range check unit 232-3 sends a determination result indicating that the 4-bit prefix range includes the input code word "1011" to the One-Hot-Dec unit 233.

The range check unit 232-4 determines whether a range from a first prefix "11100" to a last prefix corresponding to a prefix length of 5 bits includes an input code word "1011

. . . " of 5 bits. The range check unit 232-4 sends a determination result indicating that the 5-bit prefix range does not include the input code word "1011 . . . " to the One-Hot-Dec unit 233.

Then, the One-Hot-Dec unit 233 outputs 4 bits as the prefix length on the basis of the determination result of the range check unit 232-3 indicating that the 4-bit prefix range includes the input code word "1011" among the determination results received from the range check units 232-1 to 232-4.

For example, in the DEFLATE format, prefix lengths are defined from 1 bit to 15 bits. In this case, the number of times of determination (range check) as to whether an input code word is included in a prefix range is at most 15. The prefix length generation ALU unit 221 includes, for example, multiple range check units. By performing range check in parallel by the range check units (for example, 15 range check units), the prefix length generation ALU unit 221 can generate a prefix length at high speed. Note that the prefix length generation ALU unit 221 may include range check units whose number is smaller than the number of prefix lengths that are targets of the range check. In this case, each range check unit repeatedly determines whether a prefix range includes the input code word.

FIG. 10 is a block diagram illustrating an example of a configuration of the extra bit length generation LUT unit 222 in the data decompression device 15. The extra bit length generation LUT unit 222 includes, for example, one or more entries 240, one or more match detectors 241-1, 241-2, and 241-3, and a MUX 245.

Each of the one or more entries 240 corresponds to a prefix which is assigned to a dictionary match length symbol and to which extra bits of 1 bit or more is added among prefixes included in the second code table 36. The one or more entries 240 are determined by using, for example, the second code table 36 and the dictionary match length table 37. The second code table 36 includes information indicating relationship between a dictionary match length symbol (for example, a code index) and a prefix. The dictionary match length table 37 includes information indicating relationship between a dictionary match length symbol (for example, a code index) and an extra bit length.

Each of the one or more entries 240 indicates a prefix and an extra bit length that is associated with the prefix. The extra bit length is the length of extra bits that are added to the prefix. More specifically, each of the one or more entries 240 includes a prefix field 243 and an extra bits length field 244. In an entry corresponding to a certain prefix, the prefix field indicates the prefix. The extra bit length field 244 indicates an extra bit length associated with the prefix.

In the example illustrated in FIG. 10, an entry 240-1 indicates a combination of a prefix "11101" and an extra bit length "1". That is, the prefix "11101" is a prefix assigned to a dictionary match length symbol whose code index is 265 in the second code table 36. The extra bit length "1" is an extra bit length associated with the dictionary match length symbol whose code index is 265 in the dictionary match length table 37.

An entry 240-2 indicates a combination of a prefix "1011" and an extra bit length "2". That is, the prefix "1011" is a prefix assigned to a dictionary match length symbol whose code index is 270 in the second code table 36. The extra bit length "2" is an extra bit length associated with the dictionary match length symbol whose code index is 270 in the dictionary match length table 37.

An entry 240-3 indicates a combination of a prefix "100" and an extra bit length "5". That is, the prefix "100" is a prefix assigned to a dictionary match length symbol whose code index is 284 in the second code table 36. The extra bit length "5" is an extra bit length associated with the dictionary match length symbol whose code index is 284 in the dictionary match length table 37.

The match detectors 241-1, 241-2, and 241-3 use the one or more entries 240 to detect a prefix that matches the input code word. The match detectors 241-1, 241-2, and 241-3 correspond to the one or more entries 240, respectively. Each of the match detectors 241-1, 241-2, and 241-3 determines whether the input code word matches a prefix in the corresponding entry 240. Each of the match detectors 241-1, 241-2, and 241-3 then sends the determination result to the MUX 245.

The MUX 245 may output an extra bit length included in one of the one or more entries 240 on the basis of the determination results received from the match detectors 241-1, 241-2, and 241-3, respectively. More particularly, in a case where the MUX 245 receives, from one of the match detectors 241-1, 241-2, and 241-3, a determination result indicating that the input code word matches a prefix in a corresponding entry 240, the MUX 245 outputs an extra bit length in that entry 240. In a case where all the determination results received from the respective match detectors 241-1, 241-2, and 241-3 indicate that the input code word does not match a prefix in a corresponding entry 240, the MUX may output 0 as the extra bit length or does not have to output the extra bit length.

Here, an example of generating an extra bit length that corresponds to an input code word "1011 . . . " by using the one or more entries 240 illustrated in FIG. 10 will be specifically described.

The match detector 241-1 determines whether the input code word "1011 . . . " matches the prefix "11101" in the corresponding entry 240-1. The match detector 241-1 sends, to the MUX 245, a determination result indicating that the input code word does not match the prefix in the entry 240-1.

The match detector 241-2 determines whether the input code word "1011" matches the prefix "1011" in the corresponding entry 240-2. The match detector 241-2 sends, to the MUX 245, a determination result indicating that the input code word matches the prefix in the entry 240-2.

The match detector 241-3 determines whether the input code word "101" matches the prefix "100" in the corresponding entry 240-3. The match detector 241-3 sends, to the MUX 245, a determination result indicating that the input code word does not match the prefix in the entry 240-3.

Then, the MUX 245 outputs 2 bits that is the extra bit length in the entry 240-2, on the basis of the determination result of the match detector 241-2 indicating that the input code word matches the prefix in the entry 240-2 among the determination results received from the match detectors 241-1, 241-2, and 241-3.

For example, the DEFLATE format specifies that, among all the 285 symbols that include dictionary mismatch symbols and dictionary match length symbols, the 20 dictionary match length symbols each have extra bits of 1 bit or more. In this case, the number of the entries 240 that are included in the extra bit length generation LUT unit 222 is at most 20. Thus, information stored by the extra bit length generation LUT unit 222 is narrowed down to information corresponding to prefixes which are assigned to dictionary match length symbols and to which extra bits of 1 bit or more are added. Thus, in the extra bit length generation LUT unit 222 of the data decompression device 15 according to the present embodiment, an extra bit length corresponding to an input code word can be generated by a circuit with a small area and a low delay.

The code length generation unit 218 can generate the code length of the input code word by adding the prefix length and the extra bit length generated with the above configuration at the adder 223. Since there is no dependency between generation of the prefix length and generation of the extra bit length, the prefix length generation ALU unit 221 and the extra bit length generation LUT unit 222 can operate in parallel. This enables the code length generation unit 218 to generate the code length that is obtained by adding the prefix length and the extra bit length with a low delay.

Figure 11:
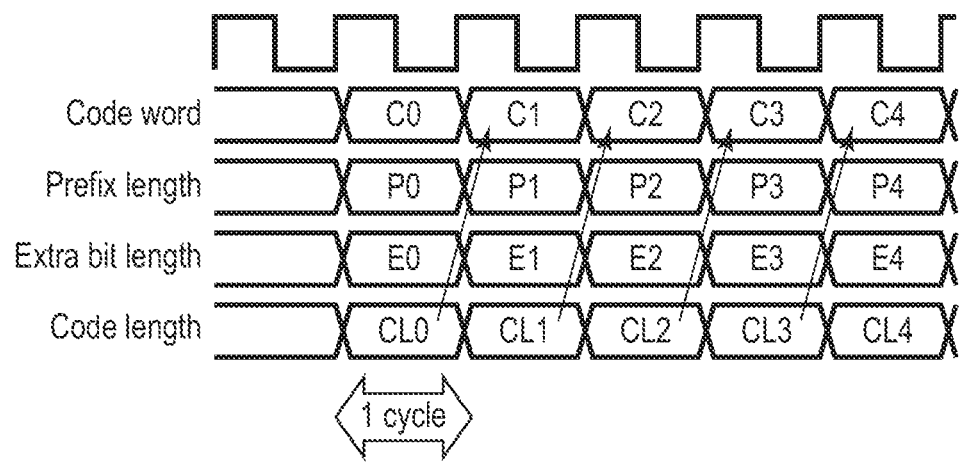
FIG. 11 is a view illustrating an example of a timing chart related to code length generation in the data decompression device according to the embodiment.

FIG. 11 is a timing chart related to code length generation in the data decompression device 15. Each of the code words C0, C1, C2, C3, and C4 includes, for example, a prefix having any bit length from 1 bit to 15 bits defined in the DEFLATE format.

As illustrated in FIG. 11, in the data decompression device 15, code lengths CL0, CL1, CL2, CL3, and CL4 are each generated in one cycle for the respective code words C0, C1, C2, C3, and C4. Specifically, for example, an operation of acquiring a prefix length P0 and an extra bit length E0 and generating the code length CL0 for the code word C0 is performed within one cycle.

As described above, in the timing chart of the data decompression device 15 according to the present embodiment, for example, the throughput in a case of generating a code length of a code word that includes a prefix of N bits or more does not decrease as compared with the timing chart of the data decompression device according to the comparative example illustrated in FIG. 7. Thus, in the data decompression device 15 of the present embodiment, it is possible to guarantee high throughput in code length generation regardless of a difference in types of symbols and prefix lengths.

Thus, in the data decompression device 15 of the present embodiment, the code length generation can be speeded up without increasing the circuit area. In other words, the throughput of decoding can be improved without increasing the circuit area.

Note that, in the above-described example, the operation of generating code lengths has been described for a code word of a dictionary mismatch symbol and a code word of a dictionary match length symbol that are included in the compressed stream. The operation of generating code lengths is also applicable to a code word of a dictionary match distance symbol included in the compressed stream. In this case, for example, the prefix length generation ALU unit 221 and the extra bit length generation LUT unit 222 are configured by using the first code table 35 and the dictionary match distance table defined in the DEFLATE format. The first code table 35 includes information indicating relationship between a dictionary match distance symbol (for example, a code index) and a prefix. The dictionary match distance table includes information indicating relationship between a dictionary match distance symbol (for example, a code index) and an extra bit length. In the data decompression device 15, similarly in the operation of generating a code length of a code word of a dictionary match distance symbol included in the compressed stream, the generation of the code length can be speeded up without increasing the circuit area.

As described above, according to the present embodiment, the throughput of decoding can be improved. The prefix length generation ALU unit 221 generates a code length of a prefix included in the compressed stream 31 by arithmetic calculation. The extra bit length generation LUT unit 222 generates a code length (extra bit length) of extra bits by using a table. The extra bits are included in the compressed stream 31. The extra bits are subsequent to the prefix. The table indicates at least the prefix and the extra bit length that is associated with the prefix. As a result, the data decompression device 15 can generate a code length of a code word that includes a first code (prefix) and a second code (extra bits) at high speed, for example. Then, the data decompression device 15 identifies a start position of the subsequent code word in the compressed stream 31 by using the code length generated at high speed. Therefore, the throughput of decoding can be improved.

Each of various functions described in the embodiment may be realized by a circuit (e.g., a processing circuit). An exemplary processing circuit may be a programmed processor such as a central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiment may be realized in a processing circuit.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A data decompression device that decodes a code included in compressed data into a symbol, the data decompression device comprising:
   a first code length generation unit configured to generate a first code length of a first code included in the compressed data by arithmetic calculation; and
   a second code length generation unit configured to generate a second code length of a second code by using a table, the second code being included in the compressed data, the second code being subsequent to the first code, the table indicating at least the first code and the second code length that is associated with the first code.

2. The data decompression device according to claim 1, wherein
   the first code is a prefix code.

3. The data decompression device according to claim 1, wherein
   the table indicates one or more codes of a first type and one or more code lengths of codes of a second type that are associated with the one or more codes of the first type, respectively, the one or more codes of the first type being assigned to all or a part of types of symbols, respectively, that occur in the compressed data, and
   the second code length generation unit is configured to:
      detect a code of the one or more codes of the first type that matches the first code by using the table; and generate, as the second code length, a code length of a code of the second type that is associated with the detected code by using the table.

4. The data decompression device according to claim 3, wherein
each of the one or more codes of the first type is a code that is assigned to a dictionary match length symbol.

5. The data decompression device according to claim 4, wherein
each of the one or more codes of the first type is a code that is assigned to the dictionary match length symbol and is associated with a code length of a code of the second type that is one or more bits.

6. The data decompression device according to claim 1, further comprising
an adder configured to acquire either a code length of a code word that corresponds to a dictionary mismatch symbol or a code length of a code word that corresponds to a dictionary match length symbol by adding the first code length and the second code length,
wherein the second code length generation unit configured to generate 0 as the second code length in a case where the first code is a code assigned to the dictionary mismatch symbol.

7. The data decompression device according to claim 6, wherein
the acquired code length of the code word is used to identify, in the compressed data, a start position of a code word subsequent to the code word having the acquired code length.

8. The data decompression device according to claim 1, further comprising
an adder configured to:
in a case where the first code is a code assigned to a dictionary mismatch symbol, acquire the first code length as a code length of a code word corresponding to the dictionary mismatch symbol; and
in a case where the first code is a code assigned to a dictionary match length symbol, acquire a code length of a code word corresponding to the dictionary match length symbol by adding the first code length and the second code length.

9. The data decompression device according to claim 1, wherein
the first code is a code that is obtained by performing canonical Huffman coding on a corresponding dictionary mismatch symbol or a dictionary match length symbol.

10. A memory system comprising:
the data decompression device according to claim 1;
a nonvolatile memory; and
a control unit configured to read the compressed data from the nonvolatile memory.

11. A data decompression method of a data decompression device that decodes a code included in compressed data into a symbol, the data decompression method comprising:
generating a first code length of a first code included in the compressed data by arithmetic calculation; and
generating a second code length of a second code by using a table, the second code being included in the compressed data, the second code being subsequent to the first code, the table indicating at least the first code and the second code length that is associated with the first code.

12. The data decompression method according to claim 11, wherein
the first code is a prefix code.

13. The data decompression method according to claim 11, wherein
the table indicates one or more codes of a first type and one or more code lengths of codes of a second type that are associated with the one or more codes of the first type, respectively, the one or more codes of the first type being assigned to all or a part of types of symbols, respectively, that occur in the compressed data, and
the data decompression method further comprises:
detecting a code of the one or more codes of the first type that matches the first code by using the table; and
generating, as the second code length, a code length of a code of the second type that is associated with the detected code by using the table.

14. The data decompression method according to claim 13, wherein
each of the one or more codes of the first type is a code that is assigned to a dictionary match length symbol.

15. The data decompression method according to claim 14, wherein
each of the one or more codes of the first type is a code that is assigned to the dictionary match length symbol and is associated with a code length of a code of the second type that is one or more bits.

16. The data decompression method according to claim 11, further comprising:
acquiring either a code length of a code word that corresponds to a dictionary mismatch symbol or a code length of a code word that corresponds to a dictionary match length symbol by adding the first code length and the second code length; and
generating 0 as the second code length in a case where the first code is a code assigned to the dictionary mismatch symbol.

17. The data decompression method according to claim 16, wherein
the acquired code length of the code word is used to identify, in the compressed data, a start position of a code word subsequent to the code word having the acquired code length.

18. The data decompression method according to claim 11, further comprising:
in a case where the first code is a code assigned to a dictionary mismatch symbol, acquiring the first code length as a code length of a code word corresponding to the dictionary mismatch symbol; and
in a case where the first code is a code assigned to a dictionary match length symbol, acquiring a code length of a code word corresponding to the dictionary match length symbol by adding the first code length and the second code length.

19. The data decompression method according to claim 11, wherein
the first code is a code that is obtained by performing canonical Huffman coding on a corresponding dictionary mismatch symbol or a dictionary match length symbol.

20. The data decompression method according to claim 11, further comprising
reading the compressed data from a nonvolatile memory.

* * * * *